(12) United States Patent
Wu et al.

(10) Patent No.: US 7,491,969 B2
(45) Date of Patent: Feb. 17, 2009

(54) ORGANIC LIGHT EMITTING DIODE DISPLAY

(75) Inventors: Yuan-Chun Wu, Taoyuan (TW); Chi-Wen Chen, Minsyong Township, Chiayi County (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 11/292,629

(22) Filed: Dec. 2, 2005

(65) Prior Publication Data

US 2007/0090345 A1  Apr. 26, 2007

(30) Foreign Application Priority Data

Sep. 15, 2005  (TW) ............... 94131934 A (51) Int. Cl.
*H01L 35/24* (2006.01)

(52) U.S. Cl. ............ 257/40; 257/79; 257/E51.019; 257/E51.02; 257/E51.021; 257/E51.022; 349/42; 349/47; 349/48

(58) Field of Classification Search .......... 257/40, 257/79, 90, 72, 59, E51.019; 348/42, 47, 348/48

See application file for complete search history.

(56) References Cited

U.S. PATENT DOCUMENTS

| 5,550,066 | A | 8/1996 | Tang et al. |
|---|---|---|---|
| 6,566,173 | B1 | 5/2003 | Choi |
| 6,873,025 | B2 * | 3/2005 | Wada et al. ......... 257/461 |
| 7,148,622 | B2 * | 12/2006 | Lin ..................... 313/504 |

(Continued)

FOREIGN PATENT DOCUMENTS

JP  59-054269  3/1984

(Continued)

OTHER PUBLICATIONS

Stewart et al., Polysilicon TFT Technology for Active Matrix OLED-Displays, IEEE Transactions on Electron Devices, vol. 48, p. 845-851, 2001.*

(Continued)

*Primary Examiner*—Wael Fahmy
*Assistant Examiner*—Minchul Yang
(74) *Attorney, Agent, or Firm*—Thomas, Kayden, Horstemeyer & Risley (57) ABSTRACT

An organic light emitting diode (OLED) display panel is provided. The OLED display panel includes a substrate, a conductive layer, an active matrix pixel array and several thin film transistors (TFTs). The conductive layer having several openings is disposed above the substrate. The active matrix pixel array having several pixels is disposed above the conductive layer. Each pixel has a display region and a non-display region. The display regions correspond to the openings. The TFTs are correspondingly disposed inside the pixels and correspondingly positioned inside the non-display regions. Each TFT includes a channel layer, a source, a drain and a gate. The channel layer is disposed above the conductive layer. The source and the drain are disposed above channel layer and respectively contact with the two opposite sides of the channel layer. The gate is disposed above the channel layer and positioned between the source and the drain.

22 Claims, 6 Drawing Sheets

U.S. PATENT DOCUMENTS

| | | | |
|---|---|---|---|
| 2002/0140643 A1* | 10/2002 | Sato | 345/76 |
| 2003/0116768 A1* | 6/2003 | Ishikawa | 257/79 |
| 2003/0127650 A1* | 7/2003 | Park et al. | 257/72 |
| 2004/0195961 A1* | 10/2004 | Lin | 313/504 |
| 2005/0012445 A1* | 1/2005 | Yamazaki et al. | 313/500 |
| 2006/0006417 A1* | 1/2006 | Kim et al. | 257/197 |
| 2006/0011980 A1* | 1/2006 | Kim | 257/347 |
| 2006/0180826 A1* | 8/2006 | Yamazaki et al. | 257/99 |

FOREIGN PATENT DOCUMENTS

JP  04-367268  12/1992

OTHER PUBLICATIONS

Deshpande et al., White-light-emitting organic electroluminescent devices based on interlayersequential energy transfer, Applied Physics Letters, vol. 75, p. 868-890, 1999.*

* cited by examiner

ORGANIC LIGHT EMITTING DIODE DISPLAY

This application claims the benefit of Taiwan application Serial No. 94131934, filed Sep. 15, 2005, the subject matter of which is incorporated herein by reference.

BACKGROUND OF THE INVENTION

1. Field of the Invention

The invention relates in general to an organic light emitting diode (OLED) display panel, and more particularly to an OLED display panel having a continual-piece conductive layer corresponding to an opening of the display region disposed between the thin film transistor (TFT) and the substrate.

2. Description of the Related Art

OLED display panel can be driven to emit via current driven or voltage driven without using a backlight source as ordinary liquid crystal display (LCD) panel would require. Thus, the OLED display panel has the advantages of self-luminance, wide view-angle, and full colors. Moreover, the OLED display panel can further be applied to portable electronic devices, such as mobile phone and personal digital assistant (PDA) for instance, and has become a display panel with great potentials.

Conventional OLED display panel includes an upper substrate, a lower substrate, an active matrix pixel array, several first thin film transistors (TFTs), several second TFTs and several organic electroluminescent devices (OELDs). The upper substrate and the lower substrate are assembled in parallel via the sealant. The active matrix pixel array is disposed above the upper substrate and positioned between the upper substrate and the lower substrate. The active matrix pixel array includes several pixels. Each pixel is defined by a first scan line and its adjacent second scan line as well as a first data line and its adjacent second data line both of which are disposed on the lower substrate. The first TFTs and the second TFTs are disposed inside the non-display regions of the pixels. Each second TFT is electrically connected to the corresponding first scan line, the first data line and the first TFT The organic electroluminescent devices are disposed inside the display regions of the pixels. Each organic electroluminescent device is electrically connected to the corresponding first TFT, a first voltage and a second voltage.

Each first TFT includes a channel layer, a gate, a source and a drain. The channel layer is disposed above the lower substrate. The source and the drain are disposed above the channel layer and respectively contact with the two opposite sides of the channel layer. The gate is disposed above the channel layer and positioned between the source and the drain. The above organic electroluminescent device is electrically connected to the drain for receiving the current outputted from the source via the channel layer and emitting according to the magnitude of the current.

However, when static charges are attached to the outer surface of the lower substrate or an external electric field is generated to the lower substrate, the static charges or the external electric field would result in extra vertical electric field interference to the channel layer of the second TFT, severely affecting the operation of the second TFT and further changing the current flowing through the channel layer. Especially, when the lower substrate becomes thinner, the unexpected and undesired interference of the electric field to the channel layer would be further intensified. Therefore, undesired luminance change would occur to partial pixels of the display region of the OLED display panel, largely reducing the display quality of OLED display panel.

SUMMARY OF THE INVENTION

It is therefore an object of the invention to provide an organic light emitting diode (OLED) display panel. The design of having a conductive layer corresponding to an opening of the display region or a continual-piece opaque conductive layer disposed between the TFT and the substrate can prevent static charges attached to the outer surface of the substrate or any external electric field from changing the current flowing through the channel layer of the TFT, undesired luminance change from occurring to partial pixels of the display region of the OLED display panel. Therefore, the display quality of OLED display panel can be largely enhanced.

The invention achieves the above-identified object by providing an organic light emitting diode (OLED) display panel. The OLED display panel includes a substrate, a conductive layer, several scan lines, several data lines and several thin film transistors (TFTs). The conductive layer having several openings is disposed above the substrate. The scan lines and the data lines are arranged over the conductive layer. The scan lines intersect the data lines to define several pixels. Each pixel has a non-display region and a display region corresponding to the openings. The TFTs are disposed over the conductive layer adjacent intersections of the scan lines and the data lines. The TFTs are positioned within the non-display regions respectively. Each TFT includes a channel layer, a source, a drain and a gate. The channel layer is disposed above the conductive layer. The source and the drain are disposed above channel layer and respectively contact with the two opposite sides of the channel layer. The gate is disposed above the channel layer and positioned between the source and the drain.

The invention further achieves the above-identified object by providing an organic light emitting diode (OLED) display panel. The OLED display panel includes a substrate, an opaque conductive layer, several scan lines, several data lines and several thin film transistors (TFTs). The opaque conductive layer is disposed above the substrate. The scan lines and the data lines are arranged over the opaque conductive layer. The scan lines intersect the data lines to define several pixels. Each pixel has a display region and a non-display region. The TFTs are disposed over the opaque conductive layer adjacent intersections of the scan lines and the data lines. The TFTs are positioned within the non-display regions respectively. Each TFT includes a channel layer, a source, a drain and a gate. The channel layer is disposed above the opaque conductive layer. The source and the drain are disposed above channel layer and respectively contact with the two opposite sides of the channel layer. The gate is disposed above the channel layer and positioned between the source and the drain.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1:
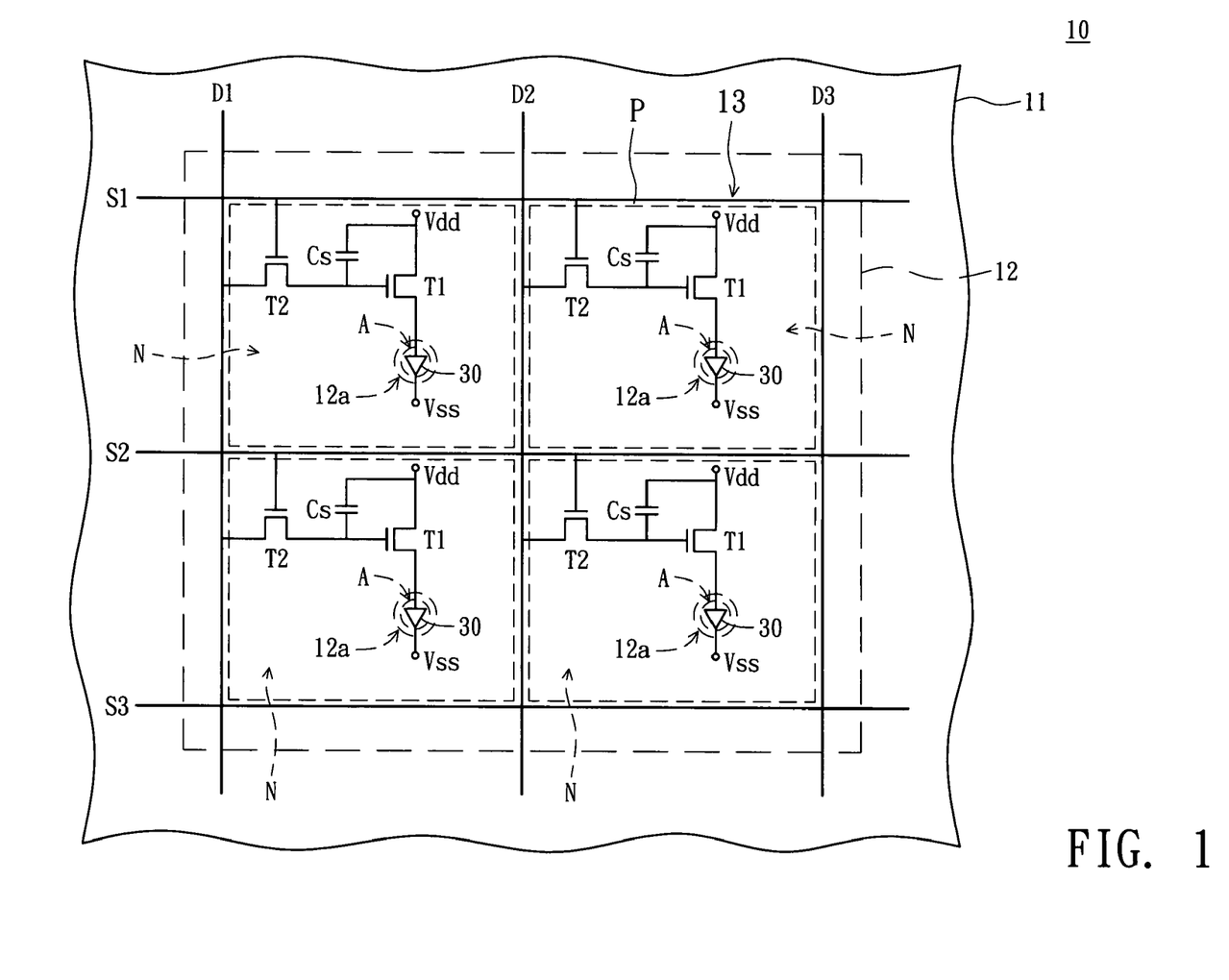
FIG. 1 is a diagram showing a circuit structure layout of an active matrix pixel array of an organic light emitting diode (OLED) display panel according to a first embodiment of the invention.
Figure 2:
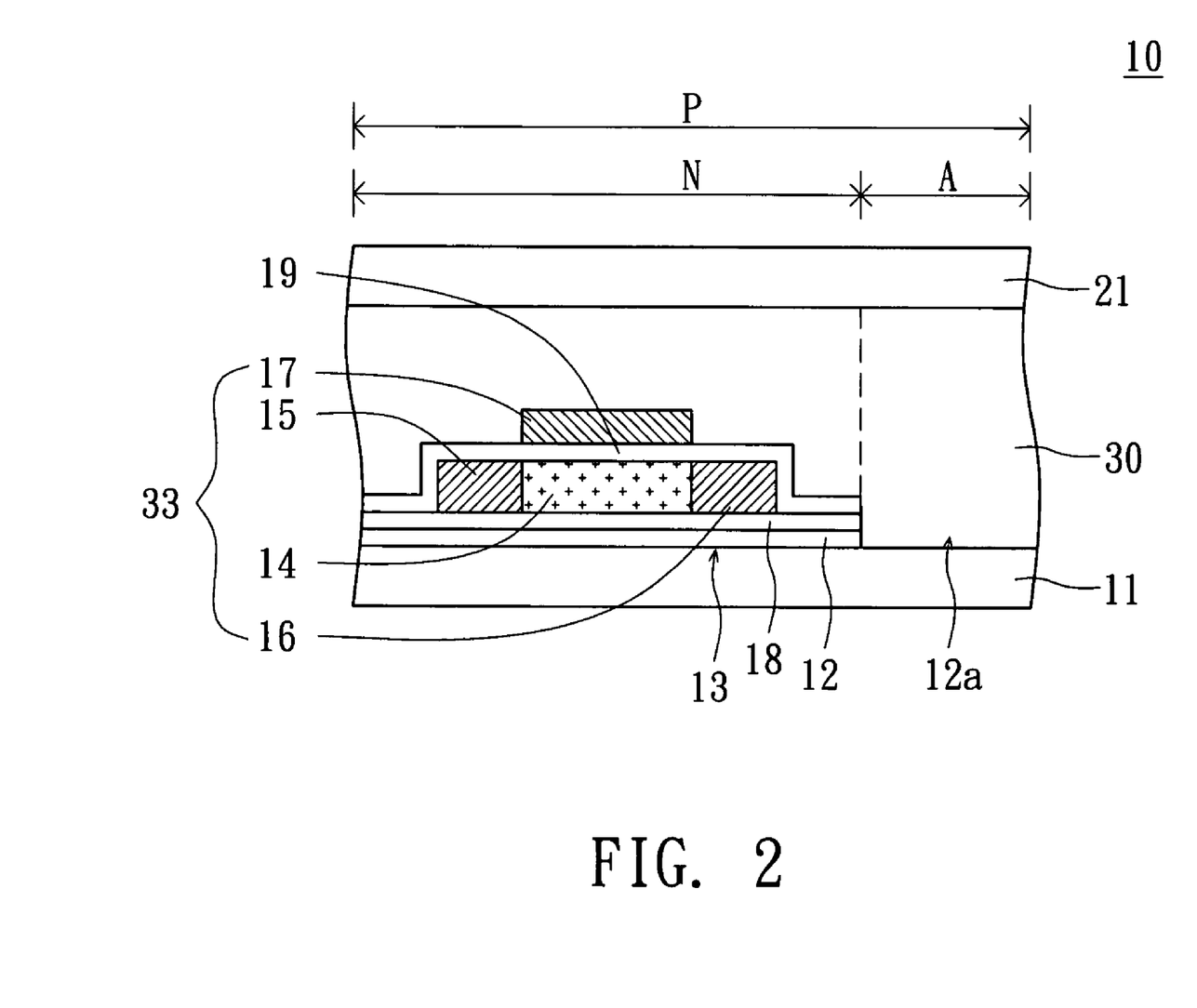
FIG. 2 is a partial sectional view of each pixel of an OLED display panel according to the first embodiment of the invention.
Figure 3:
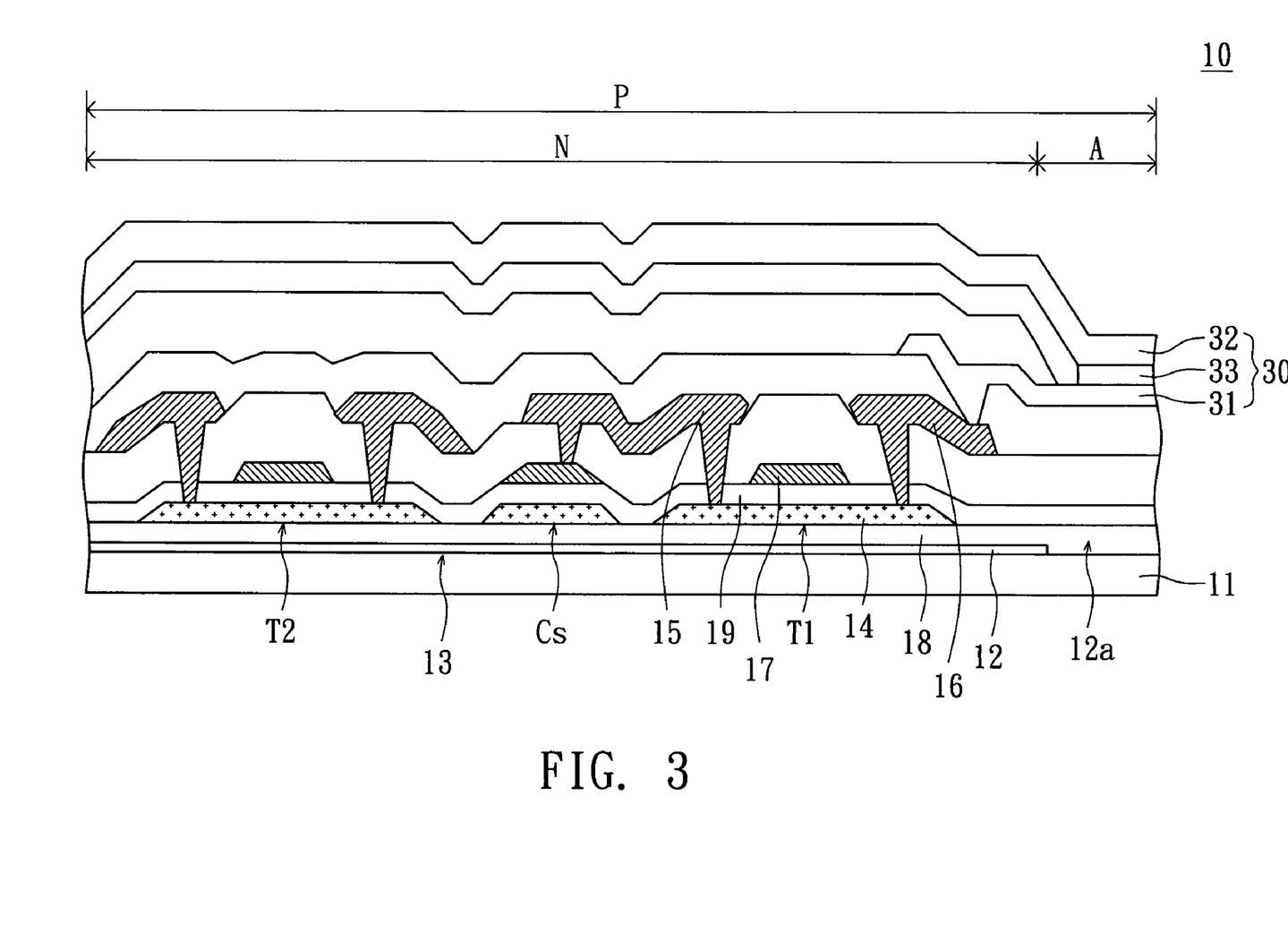
FIG. 3 is a sectional view showing the detailed structure of each pixel of an OLED display panel omitting the second substrate according to the first embodiment of the invention.

Referring to FIGS. 1~3 at the same time. FIG. 1 is a diagram showing a circuit structure layout of an active matrix pixel array of an organic light emitting diode (OLED) display panel according to a first embodiment of the invention. FIG. 2 is a partial sectional view of each pixel of an OLED display panel according to the first embodiment of the invention. FIG. 3 is a sectional view showing the detailed structure of each pixel of an OLED display panel omitting the second substrate according to the first embodiment of the invention.

As shown in FIGS. 1~3, the OLED display panel 10 at least includes a first substrate 11, a conductive layer 12, an active matrix pixel array 13 and several first thin film transistors (TFTs) T1. The conductive layer 12 is disposed above the first substrate 11 and has several openings 12a. The active matrix pixel array 13 is disposed above the conductive layer 12 and has several pixels P. The active matrix pixel array 13 is exemplified by four pixels P. Several scan lines and several data lines are arranged over the conductive layer 12. The scan lines intersect the data lines to define several pixels. However, the technology of the present embodiment of the invention is not limited thereto. Each pixel P has a display region A and a non-display region N. The display regions A correspond to the openings 12a and is exemplified by four openings 12a. However, the technology of the present embodiment of the invention is not limited thereto. The conductive layer 12 corresponds to the active matrix pixel array 13 and is disposed in a continual piece. A continual-piece conductive layer 12 having several openings 12a is disposed on the first substrate 11. The first TFTs T1 are correspondingly disposed inside the pixels P and correspondingly positioned within the non-display regions N. That is, each pixel P has a first TFT T1 disposed therein, and is exemplified by four first TFTs T1 here. The first TFTs T1 are adjacent intersections of the scan lines and the data lines. The first TFTs T1 are positioned within the non-display regions N respectively. However, the technology of the present embodiment of the invention is not limited thereto. Each first TFT T1 includes a channel layer 14, a source 15, a drain 16 and a gate 17. The channel layer 14 is disposed above the conductive layer 12. The source 15 and the drain 16 are disposed above the channel layer 14 and respectively contact with the two opposite sides of the channel layer 14. The gate 17 is disposed above the channel layer 14 and positioned between the source 15 and the drain 16. The source 15 and the drain 16 respectively and ohmically contact with the channel layer 14 via the heavy doped N+ layer. The continual-piece conductive layer 12 having several openings 12a is at least disposed between the first TFTs T1 and the first substrate 11.

The above conductive layer 12 disposed between the channel layer 14 and the first substrate 11 serves as a shielding buffer layer between the channel layer 14 and the static charges attached to the outer surface of the first substrate 11 or the interference of the electric field to the first substrate 11. Therefore, the outer surface of the first substrate 11 can be prevented from static charges or any external electric field, lest the operation of each first TFT T1 might be affected. Furthermore, the static charges or the interference of external electric field can be prevented from changing the magnitude of the current outputted from the source 13 and received at the drain 16 via the channel layer 14.

That is, the design of the present embodiment, which disposes the continual-piece conductive layer 12 having several openings 12a between the first TFTs T1 and the first substrate 11, prevents static charges from being attached to the outer surface of the first substrate 11 or any external electric field from changing the magnitude of the current flowing through the channel layer 14, and further prevents unexpected luminance change from occurring to partial pixels P of the display region A of the OLED display panel 10. Therefore, the display quality of OLED display panel 10 can be largely enhanced.

The present embodiment uses the conductive layer 12 to shield the non-display region N of each pixel P, and continually extend to the underneath of the entire active matrix pixel array 13. Therefore, the interference of the static charges attached to the outer surface of the first substrate 11 or any external electric field to each first TFT T1 can be shielded, and unexpected operation of each first TFT T1 can be avoided.

Moreover, the above conductive layer 12 includes a metal, a metallic alloy, a reflective metal or a reflective metallic alloy, such as gold, silver, aluminum, copper and its alloy for instance. Or, the above conductive layer 12 includes a transparent conductive material, such as indium tin oxide (ITO), indium zinc oxide (IZO), cadmium tin oxide (CTO), stannum dioxide ($SnO_2$) and zinc oxide (ZnO) for instance. Besides, the above conductive layer 12 can be grounded or applied by a fixed voltage, such as 1 V or 2 V for instance. Moreover, the above channel layer 14 includes amorphous silicon (a-Si) or poly-silicon (poly-Si). The first substrate 11 includes a glass substrate, a plastic substrate a ceramic substrate or a flexible substrate.

In the present embodiment, the OLED display panel 10 further includes several scan lines, several data line, several second TFTs T2, several storage capacitors Cs and several organic electroluminescent devices (OELDs) 30. The scan lines and the data lines are arranged over the conductive layer 12. The scan lines intersect the data lines to define several pixels. The present embodiment is exemplified by three scan lines S1~S3, three data lines D1~D3, four second TFTs T2, four storage capacitor Cs and four organic electroluminescent devices 30. However, the technology of the present embodiment of the invention is not limited thereto. The scan lines S1~S3 and the data lines D1~D3 are disposed above the conductive layer 12 and are perpendicular to each other for defining the active matrix pixel array 13 having several pixels P. The second TFTs T2 are correspondingly disposed inside the pixels P and correspondingly positioned within the non-display regions N. The second TFTs T2 are positioned within the non-display regions N respectively. Each second TFT T2 is electrically connected to the corresponding scan line, the corresponding data line, and the gate of the corresponding first TFT T1. That is, the gate of each second TFT T2 is electrically connected to the corresponding scan line, the source of each second TFT T2 is electrically connected to the corresponding data line, and the drain of each second TFT T2 is electrically connected to the gate of the corresponding first TFT T1. The storage capacitors Cs are correspondingly disposed inside the pixels P and correspondingly positioned within the non-display regions N. The storage capacitors Cs are positioned within the non-display regions N respectively. Each storage capacitor Cs is electrically connected to the gate of the corresponding first TFT T1, the drain of the corresponding second TFT T2, and a first fixed voltage Vdd. The organic electroluminescent devices 30 are correspondingly disposed inside the pixels P and correspondingly positioned within the display regions A. Each of the organic electroluminescent devices 30 corresponding to the openings 12a is disposed inside display region A to be electrically connected to the drain of the corresponding first TFT T1 and a second fixed voltage Vss. Each pixel P has a second TFT T2, a storage capacitor Cs and an organic electroluminescent device 30 disposed therein.

Anyone who is skilled in the technology field of the present embodiment of the invention will understand that the technology of the present embodiment of the invention is not limited thereto. For example, the OLED display panel 10 further includes an insulation layer 18 which is disposed between the channel layer 14 and the conductive layer 12. Moreover, the OLED display panel 10 further includes an insulation layer 19 which is disposed between the gate 17 and the channel layer 14. The insulation layers 18 and 19 include oxides, nitrides, oxynitrides, or silicon nitride. Besides, in the first TFT T1, in terms of relative height between the gate 17, the source 15 and the drain 16, the gate 17 can be lower than the source 15 and the drain 16 to form as a bottom gate structure as shown in FIG. 3. Or, the gate 17 can be higher than the source 15 and the drain 16 to form as a top gate structure as shown in FIG. 2. However, the technology of the present embodiment of the invention is not limited thereto.

As for the detailed structure of the organic electroluminescent device 30 is exemplified here. However, the technology of the present embodiment of the invention is not limited thereto. As shown in FIG. 3, each organic electroluminescent device 30 includes an anode 31, a cathode 32 and an organic material layer 33. The organic material layer 33 is disposed between the anode 31 and the cathode 32. Each anode 31 is electrically connected to the drain 16 of the corresponding first TFT T1. The cathode 32 can be a continual-piece metallic layer, and can be grounded or applied by a fixed voltage.

Figure 4:
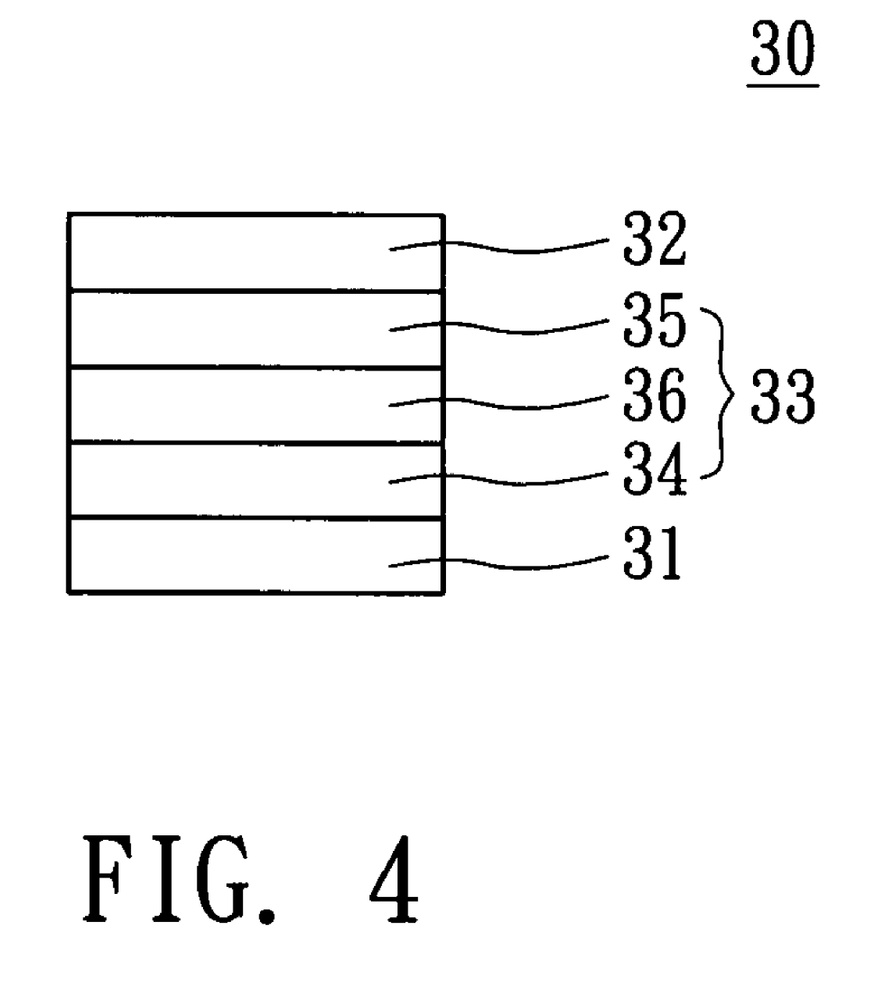
FIG. 4 is a diagram showing the detailed structure of an organic electroluminescent device in FIG. 3.

As for the detailed structure of the organic material layer 33 is exemplified here. However, the technology of the present embodiment of the invention is not limited thereto. Referring to FIG. 4, a diagram showing the detailed structure of an organic electroluminescent device in FIG. 3 is shown. The organic material layer 33 includes a hole transport layer 34, an electron transport layer 35 and an emissive layer 36. The emissive layer 36 is disposed between the hole transport layer 34 and the electron transport layer 35. The hole transport layer 34 is adjacent to the anode 31. The electron transport layer 35 is adjacent to the cathode 32. The emissive layer 36 includes a combination of a red (R) emissive material, a green (G) emissive material and a blue (B) emissive material and is used for emitting the light corresponding to the emissive material when a voltage is applied to the anode 31 and the cathode 32. Furthermore, an electron injection layer can be disposed between the above electron transport layer 35 and the cathode 32, and a hole injection layer can be disposed between the above hole transport layer 34 and the anode 31.

In the present embodiment of the invention, the OLED display panel 10 further includes a second substrate 21 as shown in FIG. 2. The second substrate 21 is assembled in parallel with the first substrate 11 via the sealant, so that the active matrix pixel array 13, the conductive layer 12, the first TFTs T1, the second TFTs T2, the storage capacitors Cs, and the organic electroluminescent devices 30 are sealed and isolated. The second substrate 21 includes a glass substrate, a plastic substrate a ceramic substrate or a flexible substrate. The conductive layer 12, having an opening 12a corresponding to the organic electroluminescent device 30, can enable the OLED display panel 10 to become a top-surface, bottom-surface or dual-surface luminous display panel via the design of the transparency or the reflectivity in the material of the anode 31 and the cathode 32. However, the technology of the present embodiment of the invention is not limited thereto.

Figure 5:
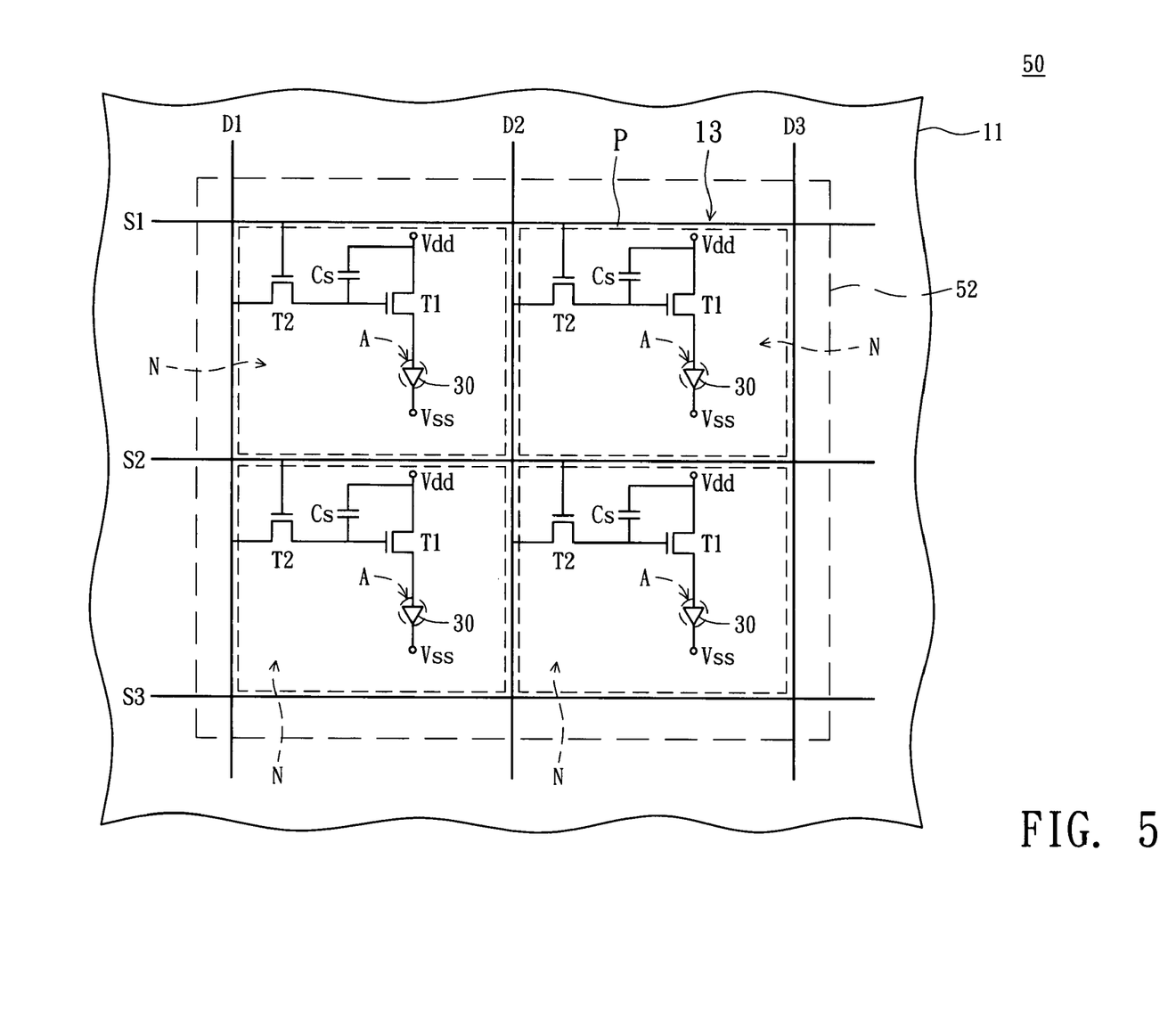
FIG. 5 is a diagram showing a circuit structure layout of an active matrix pixel array of an OLED display panel according to a second embodiment of the invention.
Figure 6:
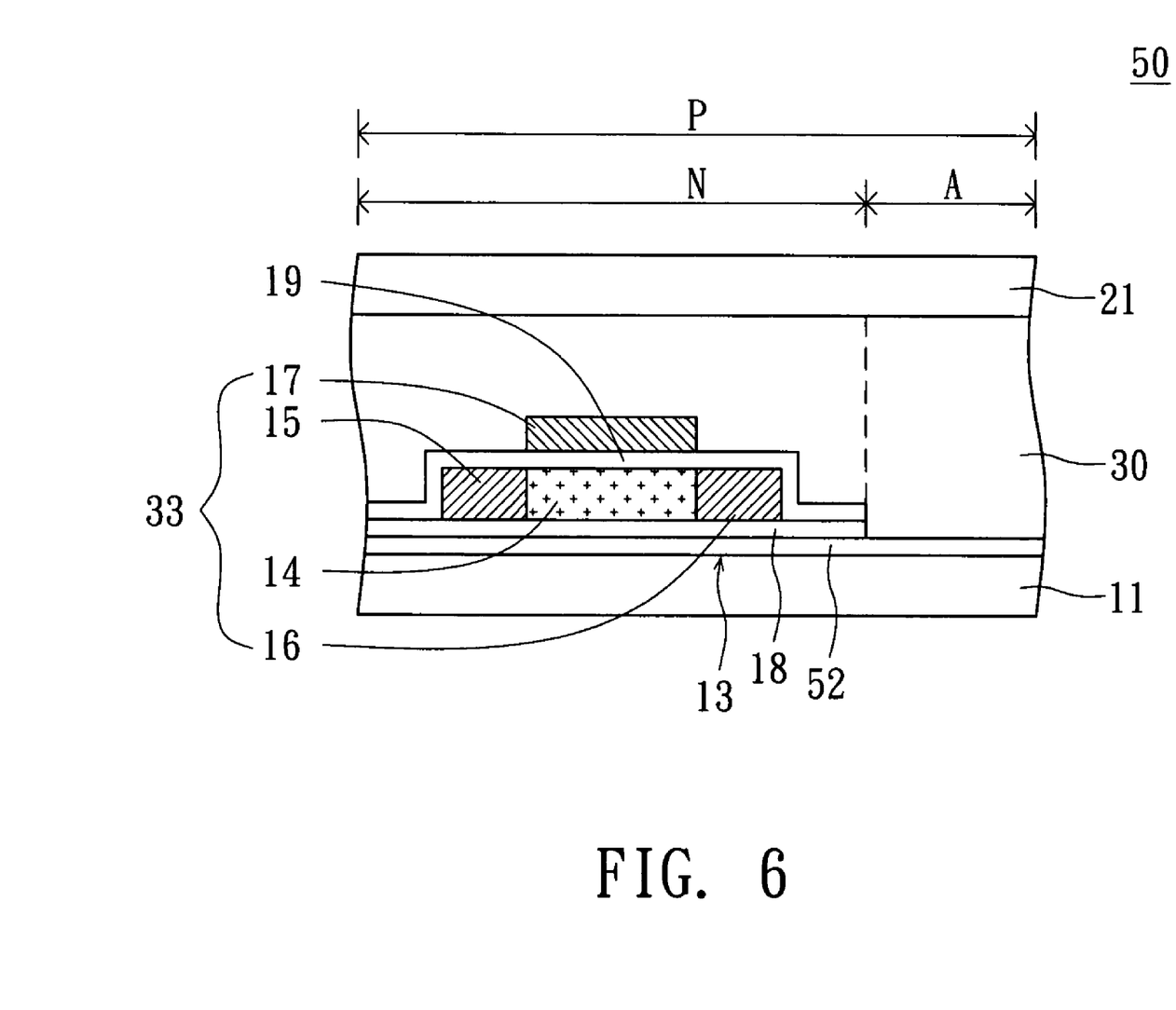
FIG. 6 is a partial sectional view of each pixel of an OLED display panel according to the second embodiment of the invention.

The design of the OLED display panel disclosed in the present embodiment of the invention, which disposes the continual-piece conductive layer having several openings between the TFT and the substrate, prevents static charges attached to the outer surface of the first substrate or any external electric field from changing the magnitude of the current flowing through the channel layer, and further prevents unexpected luminance change from occurring to partial pixels of the display region of the OLED display panel. Therefore, the display quality of OLED display panel can be largely enhanced Second Embodiment Referring to FIGS. 5~6 at the same time. FIG. 5 is a diagram showing a circuit structure layout of an active matrix pixel array of an OLED display panel according to a second embodiment of the invention. FIG. 6 is a partial sectional view of each pixel of an OLED display panel according to the second embodiment of the invention. The OLED display panel 50 of the present embodiment differs with the OLED display panel 10 of the first embodiment in the opaque conductive layer 52. As for the same components, the same labels are used and their relationships are not repeated here.

In FIGS. 5~6, the continual-piece opaque conductive layer 52 corresponds to the active matrix pixel array 13 and is disposed on the first substrate 11. The opaque conductive layer 52 disposed between the channel layer 14 and the first substrate 11 serves as a shielding buffer layer between the channel layer 14 and the static charges attached to the outer surface of the first substrate 11 or the electric field to the first substrate 11. Therefore, the outer surface of the first substrate 11 can be prevented from static charges or any external electric field, lest the operation of each first TFT T1 might be affected. Furthermore, the static charges or the interference of external electric field can be prevented from changing the magnitude of the current outputted from the source 13 and received at the drain via the channel layer 14.

That is, the design of the present embodiment of the invention, which disposes the continual-piece opaque conductive layer 52 between the first TFTs T1 and the first substrate 11, can prevent the static charges attached to the outer surface of the first substrate 11 or any external electric field from changing the magnitude of the current flowing through the channel layer 14 and prevent the display region A of partial pixels P of the OLED display panel 50 from unexpected luminance change. Therefore, the display quality of the OLED display panel 50 can be largely enhanced.

Moreover, the above opaque conductive layer 52 includes a metal, a metallic alloy, a reflective metal or a reflective metallic alloy, such as gold, silver, aluminum, or copper and its alloy. The opaque conductive layer 52 disposed between the first substrate 11 and organic electroluminescent device 30, can enable the OLED display panel 50 to become a top-surface luminous display panel via the design of the transparency or the reflectivity in the material of the anode 31 and the cathode 32 of the organic electroluminescent device 30 of FIG. 3.

It is noteworthy that if the opaque conductive layer 52 becomes thinner, the opaque conductive layer 52, like a semi-transparent conductive layer, can enable the light to pass through. Therefore, via the design of transparency or reflectivity in the materials of the anode 31 and the cathode 32 of the organic electroluminescent device 30 of FIG. 3, the OLED display panel 50 can become a top-surface, bottom-surface or dual-surface luminous display panel.

The OLED display panel disclosed in above embodiments of the invention disposes the continual-piece conductive layer having openings corresponding to the display region or disposes the continual-piece opaque conductive layer between the TFT and the substrate. Such design can prevent the static charges attached to the outer surface of the substrate or any external electric field from changing the magnitude of the current flowing through the channel layer of the TFT, and prevent the display region of partial pixels of the OLED display panel from unexpected luminance change. Therefore, the display quality of the OLED display panel can be largely enhanced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic light emitting diode (OLED) display panel, comprising:
    a substrate;
    a conductive layer, disposed above the substrate, having a plurality of openings, wherein the conductive layer comprises a transparent conductive material;
    an insulation layer, disposed on the conductive layer and filling up the openings;
    a plurality of scan lines and a plurality of data lines arranged over the conductive layer, the scan lines intersecting the data lines to define a plurality of pixels, wherein each pixel has a non-display region and a display region corresponding to the openings; and
    a plurality of first thin film transistors (TFTs), disposed over the conductive layer adjacent intersections of the scan lines and the data lines and positioned within the non-display regions respectively, wherein each first TFT comprises:
        a channel layer formed above the conductive layer;
        a source and a drain formed above the channel layer, wherein the source and the drain respectively contact with the two opposite sides of the channel layer; and
        a gate formed above the channel layer and positioned between the source and the drain.

2. The OLED display panel according to claim 1, wherein the conductive layer comprises a metal or a metallic alloy.

3. The OLED display panel according to claim 1, wherein the channel layer comprises amorphous silicon (a-Si) or poly-silicon (poly-Si).

4. The OLED display panel according to claim 1, wherein the substrate comprises a glass substrate, a plastic substrate, a ceramic substrate, or a flexible substrate.

5. The OLED display panel according to claim 1, further comprising:

a plurality of second TFTs, disposed on the conductive layer next to the first thin film transistors respectively and positioned within the non-display regions respectively, wherein each second TFT is electrically connected to the scan line, the data line and the gate;
a plurality of storage capacitors, disposed on the conductive layer and positioned within the non-display regions respectively, wherein each storage capacitor is electrically connected to the gate, the second TFT; and
a plurality of organic electroluminescent devices (OELDs), disposed on the insulation layer and positioned within the display regions respectively, wherein each organic electroluminescent device is positioned correspondingly to the opening.

6. The OLED display panel according to claim 5, wherein each organic electroluminescent device comprises an anode, a cathode and an organic material layer, the organic material layer is disposed between the anode and the cathode, and the anode is electrically connected to the drain of the first TFT.

7. The OLED display panel according to claim 6, wherein the organic material layer comprises a hole transport layer, an electron transport layer and an emissive layer, the emissive layer is disposed between the hole transport layer and the electron transport layer, the hole transport layer is adjacent to the anode, and the electron transport layer is adjacent to the cathode.

8. The OLED display panel according to claim 7, wherein the emissive layers comprise a red (R) emissive material, a green (G) emissive material and a blue (B) emissive material.

9. The OLED display panel according to claim 1, wherein the insulation layer is disposed between the channel layer and the conductive layer.

10. The OLED display panel according to claim 1, further comprising:
    an another insulation layer disposed between the gate and the channel layer.

11. The OLED display panel according to claim 1, wherein the conductive layer is electrically grounded.

12. An organic light emitting diode (OLED) display panel, comprising:
    a substrate;
    a conductive layer, disposed above the substrate, having a plurality of openings, wherein the conductive layer comprises a transparent conductive material;
    an insulation layer, disposed on the conductive layer and filling up the openings;
    a plurality of scan lines and a plurality of data lines arranged over the conductive layer, the scan lines intersecting the data lines to define a plurality of pixels, wherein each pixel has a non-display region and a display region corresponding to the openings; and
    a plurality of first thin film transistors (TFTs), disposed over the conductive layer adjacent intersections of the scan lines and the data lines and positioned within the non-display regions respectively, wherein each first TFT comprises:
        a channel layer formed above the conductive layer;
        a source and a drain formed above the channel layer, wherein the source and the drain respectively contact with the two opposite sides of the channel layer;
        a gate formed above the channel layer and positioned between the source and the drain; and
    a plurality of organic electroluminescent devices (OELDs), disposed on the insulation layer and positioned within the display regions respectively, wherein each organic electroluminescent device is positioned correspondingly to the opening and electrically connected to the corresponding first TFT.

13. The OLED display panel according to claim 12, wherein the conductive layer comprises a metal or a metallic alloy.

14. The OLED display panel according to claim 12, wherein the channel layer comprises amorphous silicon (a-Si) or poly-silicon (poly-Si).

15. The OLED display panel according to claim 12, wherein the substrate comprises a glass substrate, a plastic substrate, a ceramic substrate, or a flexible substrate.

16. The OLED display panel according to claim 12, further comprising:
   a plurality of second TFTs, disposed on the conductive layer next to the first thin film transistors respectively and positioned within the non-display regions respectively, wherein each second TFT is electrically connected to the scan line, the data line and the gate; and
   a plurality of storage capacitors, disposed on the conductive layer and positioned within the non-display regions respectively, wherein each storage capacitor is electrically connected to the gate, the second TFT.

17. The OLED display panel according to claim 12, wherein each organic electroluminescent device comprises an anode, a cathode and an organic material layer, the organic material layer is disposed between the anode and the cathode, and the anode is electrically connected to the drain of the first TFT.

18. The OLED display panel according to claim 17, wherein the organic material layer comprises a hole transport layer, an electron transport layer and an emissive layer, the emissive layer is disposed between the hole transport layer and the electron transport layer, the hole transport layer is adjacent to the anode, and the electron transport layer is adjacent to the cathode.

19. The OLED display panel according to claim 18, wherein the emissive layers comprise a red (R) emissive material, a green (G) emissive material and a blue (B) emissive material.

20. The OLED display panel according to claim 12, wherein the insulation layer is disposed between the channel layer and the conductive layer.

21. The OLED display panel according to claim 12, further comprising:
   an another insulation layer disposed between the gate and the channel layer.

22. The OLED display panel according to claim 12, wherein the conductive layer is electrically grounded.

* * * * *